United States Patent
Fai et al.

(10) Patent No.: US 9,087,846 B2
(45) Date of Patent: Jul. 21, 2015

(54) SYSTEMS AND METHODS FOR HIGH-SPEED, LOW-PROFILE MEMORY PACKAGES AND PINOUT DESIGNS

(71) Applicant: Apple Inc., Cupertino, CA (US)

(72) Inventors: Anthony Fai, Palo Alto, CA (US); Evan R. Boyle, Cupertino, CA (US); Zhiping Yang, Cupertino, CA (US); Zhonghua Wu, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 95 days.

(21) Appl. No.: 13/801,722

(22) Filed: Mar. 13, 2013

(65) Prior Publication Data

US 2014/0264906 A1    Sep. 18, 2014

(51) Int. Cl.
| | |
|---|---|
| H01L 23/48 | (2006.01) |
| H01L 23/52 | (2006.01) |
| H01L 29/40 | (2006.01) |
| H01L 23/538 | (2006.01) |
| H01L 23/498 | (2006.01) |
| H01L 25/065 | (2006.01) |
| H01L 25/18 | (2006.01) |

(52) U.S. Cl.
CPC ...... *H01L 23/5384* (2013.10); *H01L 23/49838* (2013.01); *H01L 25/0657* (2013.01); *H01L 25/18* (2013.01); *H01L 2224/16225* (2013.01); *H01L 2224/32145* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/73253* (2013.01); *H01L 2224/73265* (2013.01); *H01L 2225/0651* (2013.01); *H01L 2225/06517* (2013.01); *H01L 2225/06527* (2013.01); *H01L 2225/06537* (2013.01); *H01L 2225/06562* (2013.01); *H01L 2924/3025* (2013.01)

(58) Field of Classification Search
USPC ......... 257/697, 737, 738, 774, 778, 786, 773; 438/109
See application file for complete search history.

(56) References Cited

U.S. PATENT DOCUMENTS

| | | | |
|---|---|---|---|
| 8,008,121 | B2 | 8/2011 | Choi et al. |
| 8,345,441 | B1 | 1/2013 | Crisp et al. |
| 2003/0042619 | A1 | 3/2003 | Huang |
| 2011/0037158 | A1 | 2/2011 | Youn et al. |
| 2011/0167201 | A1 | 7/2011 | Huang |
| 2011/0278721 | A1 | 11/2011 | Choi et al. |
| 2011/0309468 | A1 | 12/2011 | Oh et al. |
| 2013/0015573 | A1* | 1/2013 | Zhou et al. ............ 257/737 |
| 2013/0021760 | A1 | 1/2013 | Kim et al. |
| 2013/0049228 | A1 | 2/2013 | Nam et al. |

FOREIGN PATENT DOCUMENTS

GB    2422963    8/2006

\* cited by examiner

*Primary Examiner* — Errol Fernandes
(74) *Attorney, Agent, or Firm* — Van Court & Aldridge LLP

(57) ABSTRACT

Systems and methods are provided for stacked semiconductor memory packages. Each package can include an integrated circuit ("IC") package substrate capable of transmitting data to memory dies stacked within the package over two channels. Each channel can be located on one side of the IC package substrate, and signals from each channel can be routed to the memory dies from their respective sides.

10 Claims, 5 Drawing Sheets

SYSTEMS AND METHODS FOR HIGH-SPEED, LOW-PROFILE MEMORY PACKAGES AND PINOUT DESIGNS

BACKGROUND

Various types of nonvolatile memory ("NVM"), such as flash memory (e.g., NAND flash memory and NOR flash memory), can be used for mass storage. For example, consumer electronic devices (e.g., portable media players) use flash memory to store data, including music, videos, images, and other media or types of information. An ongoing trend in the consumer electronic industry involves utilizing more NVMs in smaller devices, creating the necessity for creative packaging solutions that increase data storage density.

SUMMARY

Systems and methods for stacked semiconductor memory devices are provided. A stacked semiconductor memory package can include a package substrate and a number of NVM dies arranged in an arrow-shaped stack. The NVM die stack may be mounted on and communicatively coupled to the package substrate with a surface mount socket such as, for example, a Land Grid Array ("LGA"). The NVM dies can be stacked within the package in an arrow-shaped configuration in which half of the NVM dies form a staircase in a first direction, and half of the NVM dies are rotated 180° and continue the stack in a second, opposing direction. A memory controller can communicate with the NVM dies via electrical connections provided by a printed circuit board ("PCB") or printed wiring board ("PWB"), the package substrate, and wire bonds.

According to some embodiments, a novel surface mount pinout design may be used in conjunction with the above-described stacked semiconductor memory device. The pinout design may be configured to enhance signal integrity by, for example, minimizing the distance between differential pairs of connections carrying high-speed signals, minimizing the wire bond length, avoiding the crossing of high-speed signals inside the package, providing a ground ("GND") pin in the center of the high-speed pins, and separating high-speed and low-speed pins. According to further embodiments, the placement of the high-speed pins may be optimized for improving signal integrity within each individual NVM package or throughout an entire NVM system. The surface mount pinout design may accommodate two communications channels configured such that the corresponding pins of each channel are symmetrically placed when rotated 180°.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which.

DETAILED DESCRIPTION

Figure 1:
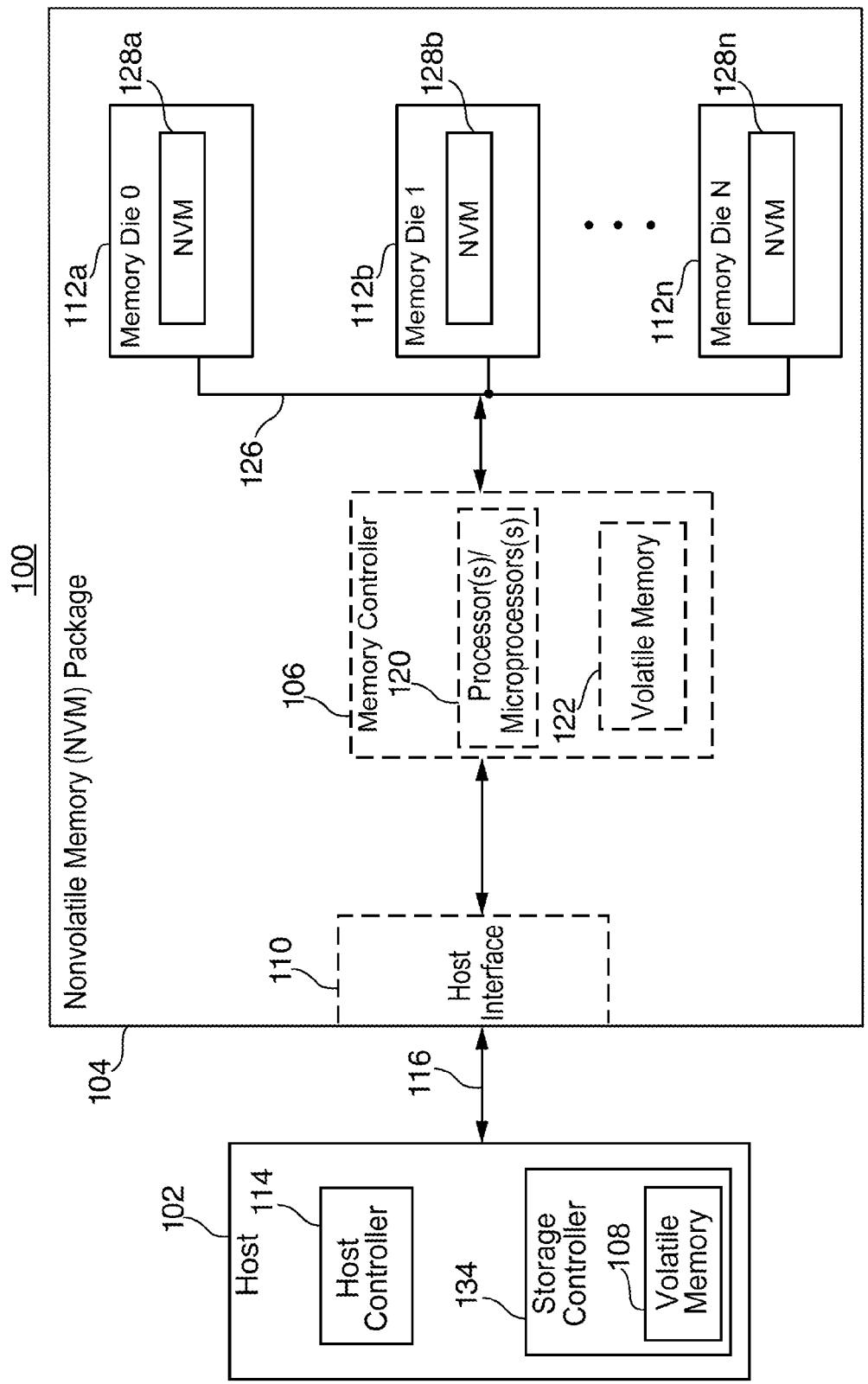
FIG. 1 is a diagram depicting an illustrative system that includes a host and an NVM package with a memory controller in accordance with various embodiments.

Surface mount packages for integrated circuits ("ICs") have become prevalent in recent years as the number of interconnects required for each IC has increased beyond the capabilities of traditional through-hole IC packages (e.g., dual-inline packages ("DIP") and pin-grid arrays ("PGA")). Examples of surface mount IC packages include ball-grid arrays ("BGA") and land-grid arrays ("LGA"). A BGA or LGA can include an array of contacts arranged in an x-y plane on a bottom surface of the package substrate. The contacts can be soldered to corresponding contacts of a second substrate such as, for example, a PCB or a PWB. The second substrate can include conductive traces for carrying signals to and from the IC package.

Exemplary embodiments disclosed herein may refer to IC package substrates, which are referred to as LGAs for the sake of clarity. However, one skilled in the art may appreciate that any suitable type of surface mount package or through hole package may be substituted for the LGA without departing from the spirit of the invention.

In particular, the contacts on the bottom surface of the LGA can be routed to the top surface using conductive vias formed through the package substrate. The LGA can also include conductive pads and/or traces on the top surface of the package substrate for communicatively coupling to one or more ICs mounted on top of the LGA. In some embodiments, wire-bond pads can be formed on the top surface of the LGA for communicatively coupling the contacts to the IC(s). Additionally, the first IC in a stack can be flip-chip bonded to the top surface of the package substrate. In some embodiments, the IC package can be an NVM package, and the flip-chip bonded IC can be a memory controller for the NVM package.

In some embodiments, the NVM package can include a stack of NVM dies mounted to the top surface of an LGA. The stack can be arrow-shaped, with the first half of the NVM dies forming a staircase in a first direction and the second half of the NVM dies continuing the stack and forming a staircase in the opposite direction. This arrow-shaped stacked die layout can provide an exposed portion on the top surface of each NVM die for receiving wire-bond wires. The first half of the NVM dies can be wire bonded to the package substrate from the side of the LGA adjacent to the steps of the staircase, while the second half of the NVM dies can be wire bonded to the LGA from the opposite side (i.e., adjacent to the steps of the second staircase). The NVM dies in the second staircase may be rotated 180° from those in the first half such that the bonding pads are facing in the correct direction to receive the wire-bond wires.

The contacts formed on the bottom side of the LGA can be arranged such that a first set of contacts (e.g., a first channel) can be arranged on the side of the package substrate closest to the steps of the first staircase to minimize wiring distance between those contacts and the wire-bond pads on the top surface. The first set of contacts can be dedicated to the first half of the NVM dies. Similarly, a second set of contacts (e.g., a second channel) can be arranged on the side of the package substrate closest to the steps of the second staircase. The second set of contacts can be dedicated to the second half of the NVM dies. Further optimizations of various contact arrangements will be discussed in more detail below with respect to FIGS. 4 and 5.

FIG. 1 is a diagram depicting system 100, including host 102 and NVM package 104. Host 102 may communicate with NVM package 104, which can include memory controller 106, host interface 110, and memory dies 112a-n with corresponding NVMs 128a-n. Host 102 can be any of a variety of host devices and/or systems, such as a portable media player, a cellular telephone, a pocket-sized personal computer, a personal digital assistant ("PDA"), a desktop computer, a laptop computer, and/or a tablet computing device. NVM package 104 can include NVMs 128a-n (e.g., in the memory dies 112a-n) and can be a ball grid array package or other suitable type of integrated circuit ("IC") package. NVM package 104 can be part of and/or separate from host 102. For example, host 102 can be a board-level device and NVM package 104 can be a memory subsystem that is installed on the board-level device. In other embodiments, NVM package 104 can be coupled to host 102 with a wired (e.g., SATA) or wireless (e.g., Bluetooth™) interface.

Host 102 can include host controller 114 that is configured to interact with NVM package 104. For example, host 102 can transmit various access requests, such as read, program, and erase operations, to NVM package 104. Host controller 114 can include one or more processors and/or microprocessors that are configured to perform operations based on the execution of software and/or firmware instructions. Additionally and/or alternatively, host controller 114 can include hardware-based components, such as application-specific integrated circuits ("ASICs"), that are configured to perform various operations. Host controller 114 can format information (e.g., commands, data) transmitted to NVM package 104 according to a communications protocol shared between host 102 and NVM package 104.

Host 102 can include storage component 134, which may include volatile memory 108. Volatile memory 108 can be any of a variety of volatile memory types, such as cache memory or RAM. Host 102 can use volatile memory 108 to perform memory operations and/or to temporarily store data that is being read from and/or written to NVM package 104. For example, volatile memory 108 can temporarily store a queue of memory operations to be sent to, or to store data received from, NVM package 104.

Host 102 can communicate with NVM package 104 over communications channel 116. Communications channel 116 can be fixed (e.g., fixed communications channel), detachable (e.g., universal serial bus (USB), serial advanced technology (SATA)), or wireless (e.g., Bluetooth™). Interactions with NVM package 104 can include providing access requests and transmitting data, such as data to be programmed to one or more of memory dies 112a-n, to NVM package 104. Communication over communications channel 116 can be received at host interface 110 of NVM package 104. Host interface 110 can be part of and/or communicatively connected to memory controller 106. In some embodiments, for example when memory controller 106 is located outside of NVM package 104, host interface 110 may also be omitted from NVM package 104.

Like host controller 114, memory controller 106 can include one or more processors and/or microprocessors 120 that are configured to perform operations based on the execution of software and/or firmware instructions. Additionally and/or alternatively, memory controller 106 can include hardware-based components, such as ASICs, that are configured to perform various operations. Memory controller 106 can perform a variety of operations, such as performing access requests initiated by host 102.

Host controller 114 and memory controller 106, alone or in combination, can perform various memory management functions, such as garbage collection and wear leveling. In implementations where memory controller 106 is configured to perform at least some memory management functions, NVM package 104 can be termed "managed NVM" (or "managed NAND" for NAND flash memory). This can be in contrast to "raw NVM" (or "raw NAND" for NAND flash memory), in which host controller 114, external to NVM package 104, performs memory management functions for NVM package 104.

In some embodiments, memory controller 106 can be incorporated into the same package as memory dies 112a-n. In other embodiments, memory controller 106 may be physically located in a separate package or in the same package as host 102. In some embodiments, memory controller 106 may be omitted, and all memory management functions that are normally performed by memory controller 106 (e.g., garbage collection and wear leveling) can be performed by a host controller (e.g., host controller 114).

Memory controller 106 may include volatile memory 122 and NVM 124. Volatile memory 122 can be any of a variety of volatile memory types, such as cache memory or RAM. For example, memory controller 106 can use volatile memory 122 to perform access requests and/or to temporarily store data that is being read from and/or written to NVMs 128a-n in memory dies 112a-n. In addition, volatile memory 122 can store firmware and memory controller 106 can use the firmware to perform operations on NVM package 104 (e.g., read/program operations).

Memory controller 106 can use shared internal bus 126 to access NVMs 128a-n, which may be used for persistent data storage. Although only one shared internal bus 126 is depicted in NVM package 104, an NVM package can include more than one shared internal bus. Each internal bus can be connected to multiple (e.g., 2, 3, 4, 8, 32, etc.) memory dies as depicted with regard to memory dies 112a-n. Memory dies 112a-n can be physically arranged in a variety of configurations, including a stacked configuration, and may be, according to some embodiments, IC dies. According to some embodiments, memory dies 112a-n arranged in stacked configurations can be electrically coupled to memory controller 106 with conductive epoxy traces. These embodiments will be discussed in more detail with respect to FIGS. 3-5 below.

NVMs 128a-n can be any of a variety of NVM, such as NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), or any combination thereof.

Figure 2:
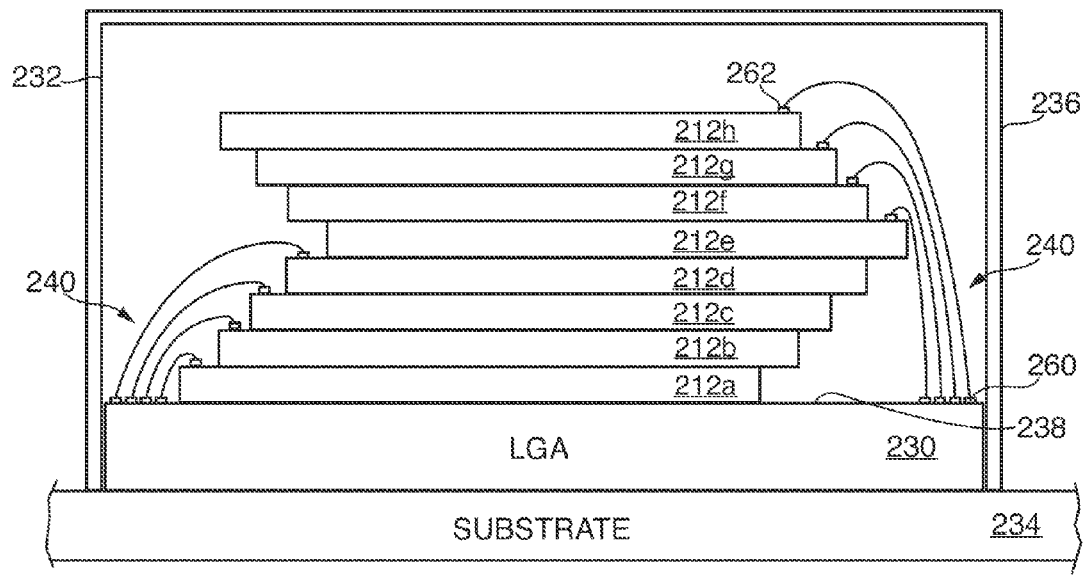
FIG. 2 is a cross-sectional view of the NVM package of FIG. 1 in accordance with various embodiments.

FIG. 2 is a cross-sectional view of NVM package 204 in accordance with various embodiments. NVM package 204 can include memory dies 212a-h and LGA 230, which may be, as disclosed above, any suitable package substrate such as an LGA, BGA, or PGA, for example. NVM package 204, and memory dies 212a-h can correspond to NVM package 104 and memory dies 112a-n of FIG. 1, respectively. NVM package 204 may also include encapsulate 232 and wire-bond wires 240. In particular, NVM package 204 can be a "raw" NVM package that does not include a dedicated, in-package memory controller such as memory controller 106, for example.

The above-referenced elements may be mounted on substrate 234, which can be a substrate such as, for example, a PCB or PWB for an entire NVM system (e.g., system 100 of FIG. 1) or a portion of an NVM system. Substrate 234 may include conductive leads that facilitate connectivity between multiple components of a system. For instance, LGA 230 of NVM package 204 can be communicatively coupled to contacts (not shown) of substrate 234 (e.g., using solder), and printed conductors (not shown) can electrically couple memory dies 212a-h to a host controller (e.g., host controller 114 of FIG. 1) and/or other system components.

To prevent damage to NVM package 204 during operation or in extreme conditions, LGA 230, encapsulate 232, and memory dies 212a-h may be made of materials with similar coefficients of thermal expansion. For example, memory dies 212a-h can be integrated circuit dies processed on a Si wafer, LGA 230 may be a laminate formed from layers of cloth or fiber materials and a resin, and encapsulate 232 may be a plastic, a ceramic, or a silicone rubber compound. In other embodiments, memory controller 206 can be processed on any suitable substrate (e.g., Ge, GaAs, InP) and encapsulate 232 can be any suitable encapsulate material that provides physical and environmental protection for memory controller 206. Encapsulate 232 may also be chosen to efficiently dissipate heat from memory dies 212a-h.

NVM package 204 may be fully or partially encapsulated in an electromagnetic interference ("EMI") shield 236. EMI shield 236 may prevent the emission of electromagnetic radiation from components of NVM package 204. Similarly, EMI shield 236 may prevent damage to components of NVM package 204 from electromagnetic and/or radiofrequency interference emitted by external sources. In general, EMI shield 236 can function as a Faraday cage, which can block the propagation of electric and/or electromagnetic fields. Furthermore, EMI shield 236 may be coupled to ground in order to dissipate electric charge. As shown in FIG. 2, EMI shield 236 may be a "can" type EMI shield that encloses a portion or all of NVM package 204. According to some embodiments, space within EMI shield 236 may be empty (e.g., filled with air). In other embodiments, space within EMI shield 336 may be filled with a suitable dielectric material. EMI shield 236 may also, according to some embodiments, be deposited over encapsulate 232 material as a conformal conducting thin film using standard coating techniques (e.g., physical vapor deposition ("PVD"), chemical vapor deposition ("CVD"), spin coating, etc.).

Although embodiments described herein refer to specific semiconductor dies (e.g., memory controllers and memory dies), one skilled in the art will appreciate that a semiconductor package (e.g., NVM package 204) may incorporate any suitable combination of semiconductor dies. For example, a package might include a microprocessor die connected to a stack of other semiconductor dies, including volatile memory, nonvolatile memory, and/or one or more analog circuit dies.

NVM package 204 may be an example of a stacked semiconductor die configuration because one or more individual semiconductor chips (e.g., memory dies 212a-h) are arranged in a stacked configuration. In some embodiments, memory dies 212a-h affixed to the surface of LGA 230, and to each other, using any suitable adhesive (e.g., an epoxy). Stacked semiconductor die configurations can provide a number of advantages over circuit board configurations in which individual semiconductor chips are mounted laterally on a circuit board. For example, dies in stacked configurations have a smaller "footprint," which can be beneficial in applications where a small overall device size is desired. In fact, because the footprint of the package can be very close to the dimensions of the largest semiconductor chip, NVM package 204 may be referred to as a "chip-scale package." Stacking memory dies also increases the data storage density of an electronic device, allowing more data to be stored in the same physical space.

Although eight memory dies are shown in FIG. 2, one skilled in the art will appreciate that any suitable number of memory dies can be incorporated into NVM package 204, subject to space, wiring, and/or structural limitations.

Individual memory dies, according to some embodiments, can be communicatively coupled to LGA 230 using wire-bond wires 240. The wire bonding process can involve attaching flexible wires from bond pads 260 on a first surface 238 of LGA 230 to bond pads 262 formed on memory dies 212a-h. The wires may be made of any suitable highly-conductive, ductile metal (e.g., Al, Au, Cu). Depending on the number of required external connections, the bond pads on LGA 230 and/or memory dies 212a-h may be staggered. Staggering the bond pads can decrease the bond-pad pitch (the center to center distance between bond pads) and allow more external connections than inline bond pads. Staggered bond pads may require the bond pads on LGA 230 to be terraced to prevent shorting between adjacent wires.

Through this wire-bonding process, memory dies 212a-h can be communicatively coupled to LGA 230 and various other system components (e.g., host 102 of FIG. 1). Wire-bond wires 240 and electrical connections of LGA 230 and substrate 234, combined, can represent, for example, shared internal bus 126 of FIG. 1.

To form the arrow-shaped structure depicted in FIG. 2, individual memory dies 212a-h can be stacked and glued together with adjacent memory dies being offset slightly from one another, resulting in an exposed surface on each memory die. The exposed surfaces of memory dies 212a-h can include bond pads 262 for coupling to wire-bond wires 240. As depicted in FIG. 2, half of the memory dies (i.e., memory dies 212a-d) can form a staircase in a first direction leaving exposed surfaces closer to a first edge of NVM package 204, and half of the memory dies (i.e., memory dies 212e-h) can form a staircase in a second direction leaving exposed surfaces closer to a second edge of NVM package 204 that opposes the first side. Wire-bond wires 240 can be coupled to memory dies 212a-d and 212e-h from the first side and second side of NVM package 204, respectively.

Figure 3:
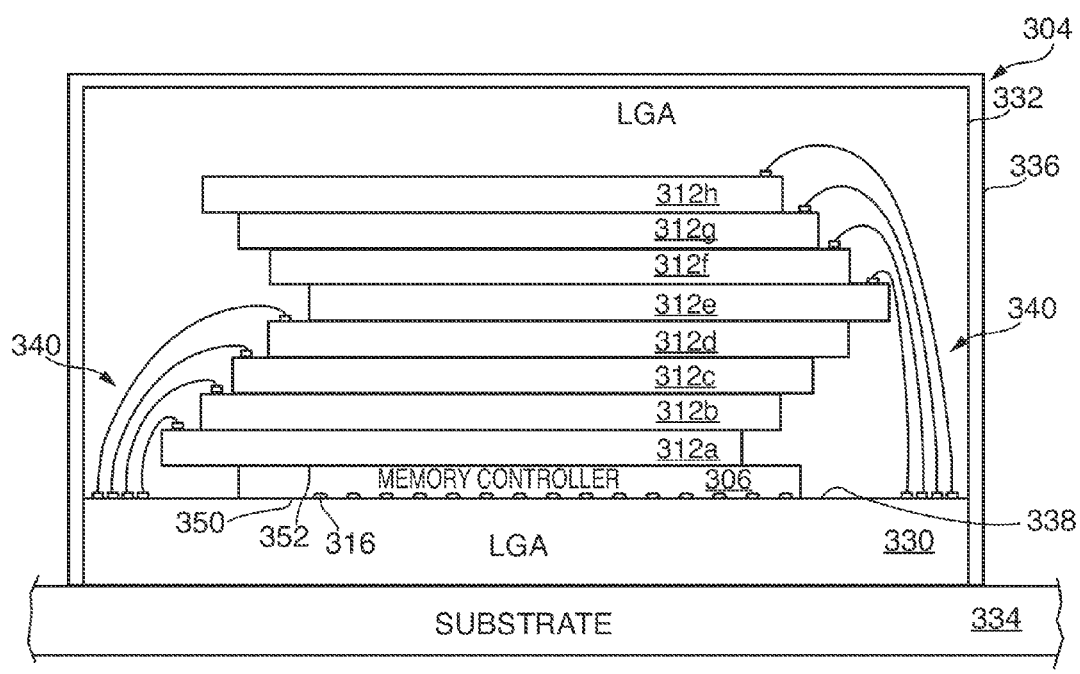
FIG. 3 is an cross-sectional view of a raw NVM package in accordance with various embodiments.

FIG. 3 is a cross-sectional view of NVM package 304 in accordance with various embodiments. NVM package 304 can include memory controller 306, memory dies 312a-f, and LGA 330. NVM package 304, memory controller 306, memory dies 312a-h can correspond to, for example, NVM package 104, memory controller 106, and memory dies 112a-n of FIG. 1, respectively. NVM package 304 may also include encapsulate 332 and wire-bond wires 340. The above elements may be mounted on substrate 334, which can be a substrate for an entire NVM system (e.g., system 100 of FIG. 1) or a portion of an NVM system. Because NVM package 304 can include memory controller 306, NVM package 304 can be a "managed" NVM.

As shown in FIG. 3, memory controller 306 can be bonded with any suitable adhesive (e.g., an epoxy) to LGA 330, which may be, as disclosed above, any suitable package substrate such as an LGA, BGA, or PGA, for example. Further, memory controller 306 can include an active surface 350 and an inactive surface 352. In these embodiments, active surface 350 of memory controller 306 can be flip-chip bonded to a first surface 338 of LGA 330. Accordingly, memory controller 306 can include solder bumps 316 formed on active surface 350, which can be used for flip-chip bonding memory controller 306 to first surface 338 of LGA 330. Memory dies 312a-h can be mounted on inactive surface 352 of memory controller 306 using any suitable adhesive (e.g., an epoxy).

In general, flip-chip bonds can reduce the chip-to-package interconnect length in comparison with other bonding methods (e.g., wire bonding and TAB bonding), resulting in reduced inductance and, therefore, improved high-speed signal integrity. Solder bumps 316 may be added to memory controller dies during wafer processing. When memory controller 306 and LGA 330 are properly aligned, solder bumps 316 can be reflowed to create an electrical connection between memory controller 306 and first surface 338 of LGA 330. An underfill adhesive may be added between memory controller 306 and LGA 330 to reduce stress on solder bumps 316.

In other embodiments not shown in the figures, memory controller 306 may be coupled to LGA 330 with active surface 350 facing away from first surface 338 of LGA 330. In these embodiments, memory controller 306 may be communicatively coupled to LGA 330 via wire-bond wires 340 along with memory dies 312a-h. Accordingly, memory controller 306 may include wire-bond pads on an exposed surface for coupling to wire-bond wires 340.

Figure 4:
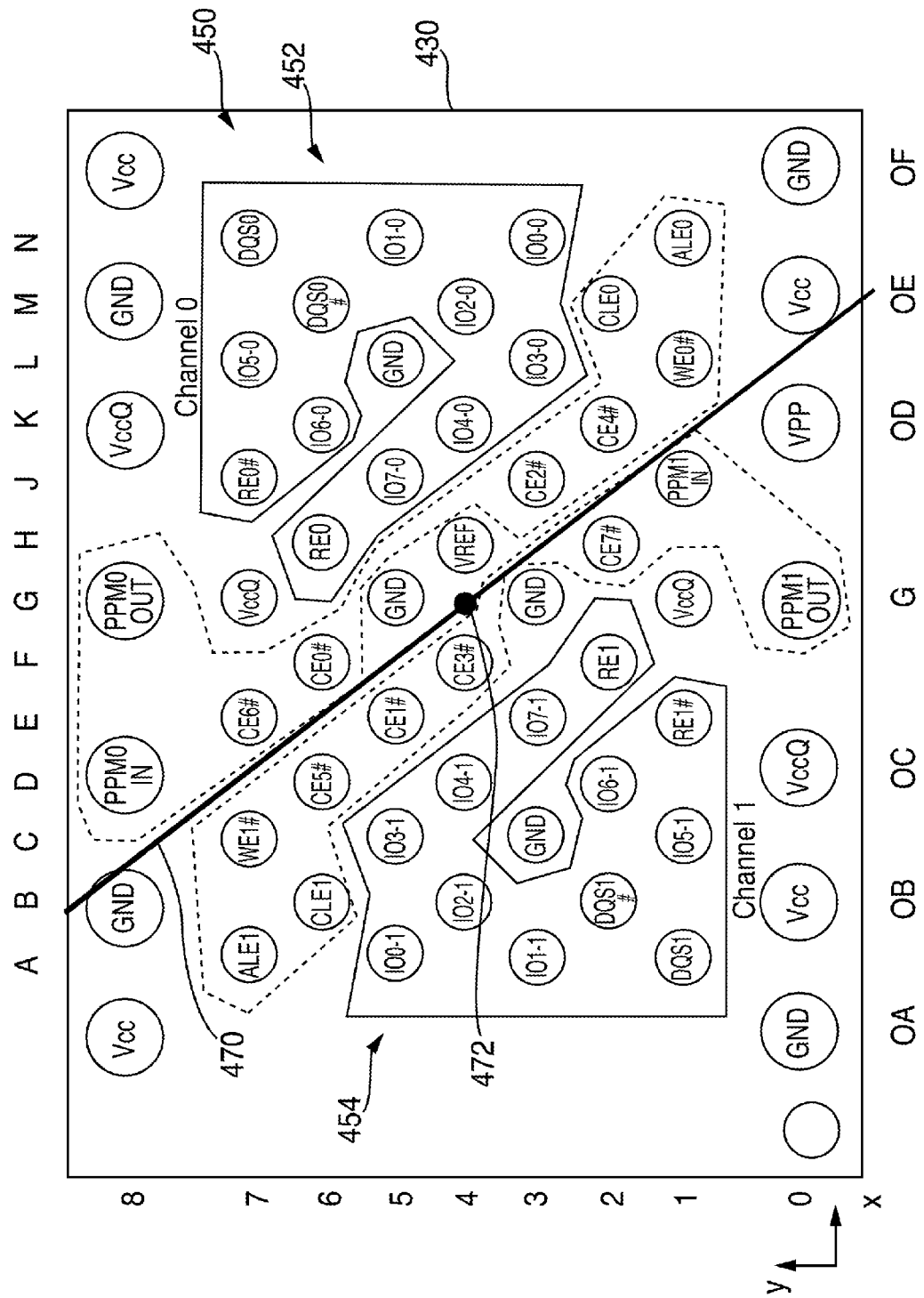
FIG. 4 is a bottom plan view of a surface mount package substrate illustrating a pinout design in accordance with various embodiments.

FIG. 4 is an illustrative plan view of the underside of LGA 430, in accordance with some embodiments. LGA 430 can correspond to LGA 230 of FIG. 2, for example. An array of contacts 450 can be arranged on the underside of LGA 430 for conducting signals between an NVM package (e.g., NVM package 204) and various other system components (e.g., host 102 of FIG. 1). Contacts 450 can include the following contacts suitable for communicating with one or more dies in an NVM package:

Vcc: Supply Voltage (Read) (×4)
VccQ: Supply Voltage (I/O) (×4)
Vpp: Supply Voltage (Program/Erase)
Vref: Reference voltage
GND: Ground (×6)
PPM0-PPM1 IN: Power Control INPUT Channels 0,1
PPM0-PPM1 OUT: Power Control OUTPUT Channels 0,1
WE0#-WE1#: Write Enable Channels 0,1
CLE0-CLE1: Command Latch Enable Channels 0,1
ALE0-ALE1: Address Latch Enable Channels 0,1
RE0-RE1: Read Enable Channels 0,1
RE0#-RE1#: Read Enable Channels 0,1
CE0#-CE7#: Chip Enable 0-7
R/B0-R/B1: Ready/Busy Channels 0,1
DQS0-DQS1: Data Queue Strobe Channels 0,1
DQS0#-DQS1#: Data Queue Strobe Channels 0,1
IO (0-7)-0: Data I/O Pins 0-7 Channel 0
IO(0-7)-1: Data I/O Pins 0-7 Channel 1

The array of contacts 450 can be arranged in the x-y with row (y-axis) coordinates extending from 0-8 and column coordinates extending from OA-OF for power and ground pins, which can be arranged at the edges of the array, and A-N for signal pins, which can be arranged generally centrally in the array with respect to the y-axis. One skilled in the art will appreciate that the pin coordinate system is arbitrary and that any suitable coordinate system may be employed.

The Data I/O Pins (e.g., IO(0-7)-0 and IO(0-7)-1), can be used for communicating high-speed data signals to one or more NVM dies in an NVM package (e.g., memory dies 112a-n of FIG. 1). In particular, each set of Data I/O Pins can represent an 8-bit communications channel between a controller and an NVM die (e.g., one of memory dies 212a-h of FIG. 2). For instance, for the raw NAND NVM package disclosed above with respect to FIG. 2, the controller may be a controller of a host device (e.g., host controller 114 of FIG. 1). On the other hand, for the managed NAND NVM package disclosed above with respect to FIG. 3, the controller may be a memory controller of the NVM package (e.g., memory controller 306 of FIG. 3).

In high-speed applications, minimizing the distance between differential pairs and reducing the overall distance a signal must travel can help to improve signal integrity over Data I/O Pins. In particular, the distance between differential-pair contacts may be required to be less than a predetermined threshold distance. Thus, an optimal pinout design may reduce the distance between pins carrying differential pair signals as well as the overall distance those signals travel. These goals may be met generally with the pin arrangement displayed in FIG. 4.

The Data I/O Pins of each channel can be arranged in a loop-shape surrounding a GND pin. Differential pair signals can be carried over adjacent Data I/O Pins in the loop-shaped layouts. For example, the following pins may carry differential pair signals for Channel 0: IO0-0 and IO3-0; IO1-0 and IO2-0; IO4-0 and IO7-0; and IO5-0 and IO6-0. The same can apply, mutatis mutandis, to the Data I/O Pins for Channel 1. The incorporation of a GND pin within the loop-shaped Data I/O Pin layout can further help to improve signal integrity by reducing the ground offset between the pins of each differential pair. The loop-shaped layout can also reduce the need to cross high-speed signal carriers within the NVM package, reducing cross-talk between the carriers and thereby improving signal integrity.

Additional pins may be part of the loop-shaped Data I/O Pin layout including, for example, the RE0, RE1, RE0#, RE1#, DQS0#, and DQS1# pins.

The loop-shaped layouts of the Data I/O pins can be offset from one another on y-axis and arranged between rows of pins dedicated to non-Data I/O activity. For example, GND, VccQ, Vcc, PPM0 IN, and PPM1 IN pins can be arranged in rows along the top and bottom edges of the array, and the loop-shaped Data I/O pin layout can be arranged between those rows. Additional pins, including write enable, chip enable, address latch enable, PPM OUT, and command latch enable pins, can be arranged in diagonal rows in between the loop-shaped layouts.

According to some embodiments, the pins dedicated to each channel may be symmetrically placed about a central point of rotational symmetry 470. Pins dedicated to each channel can be arranged on either side of a central axis 472 drawn through the point of rotational symmetry. Thus, as shown in FIG. 4, Data I/O pins IO(0-7)-0 can correspond to Data I/O pins IO(0-7)-1 reflected about the point of rotational symmetry. Similarly, each pin of Channel 0 maps to a corresponding pin of Channel 1 when reflected about the axis of symmetry.

LGA 430 may be particularly useful for routing signals to NVM die of a stacked NVM package such as NVM package 204 of FIG. 2, for example. Because half of the memory dies (i.e., memory dies 212a-d) can form a staircase in a first direction leaving exposed surfaces on closer to a first edge of NVM package 204, signals routed from a subset of contacts 450 dedicated to a single channel (e.g., Channel 0) and arranged on a portion of LGA 430 (e.g., closer to the first edge of NVM package 204) can be routed to bond pads of memory dies 212a-d with minimal signal carrier length. For instance, the first subset 452 of contacts 450, dedicated to Channel 0, can be arranged on a portion of LGA 430 closest to the exposed surfaces of memory dies 212a-d. A second subset 454 of contacts 450, dedicated to Channel 1, can be arranged on the opposite side of the array (e.g., on the opposite side of central axis 472) and, therefore, closest to the exposed surfaces of memory dies 212*e-h*. Because memory dies 212*e-h* can be rotated 180° from memory dies 212*a-d* and Channel 0 can be rotated 180° from Channel 1, each channel can be routed to a respective set of memory dies using identical wiring layouts (though rotated 180° from one another).

Figure 5:
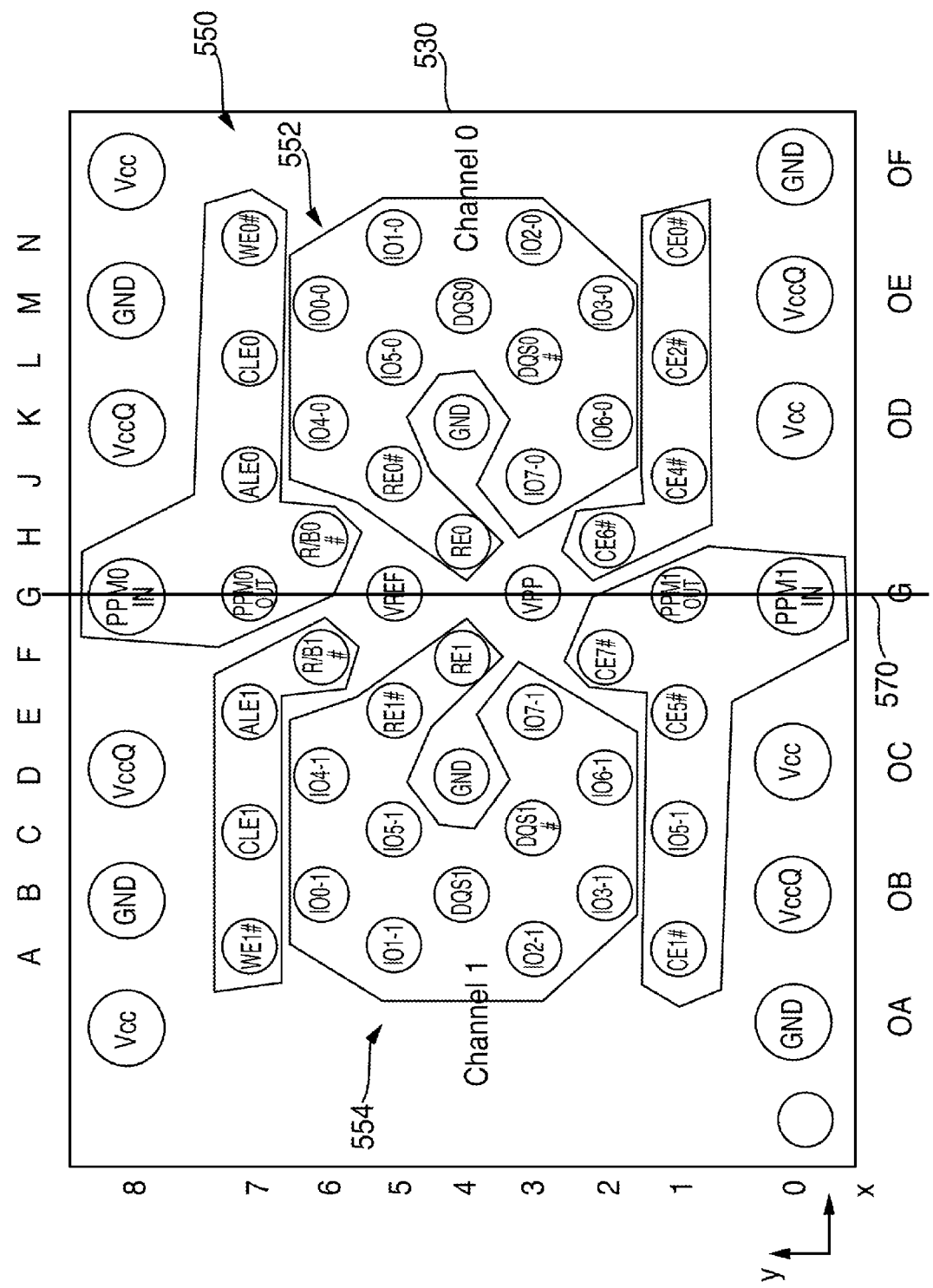
FIG. 5 is another bottom plan view of a surface mount package substrate illustrating another pinout design in accordance with various embodiments.

FIG. 5 is an illustrative plan view of the underside of LGA 530, in accordance with some embodiments. LGA 530 can correspond to LGA 230 of FIG. 2, for example. An array of contacts 550 can be arranged on the underside of LGA 530 for conducting signals between an NVM package (e.g., NVM package 204) and various other system components (e.g., host 102 of FIG. 1). Contacts 550 can include the following contacts suitable for communicating with one or more dies in an NVM package:

Vcc: Supply Voltage (Read) (×4)
VccQ: Supply Voltage (I/O) (×4)
Vpp: Supply Voltage (Program/Erase)
Vref: Reference voltage
GND: Ground (×6)
PPM0-PPM1 IN: Power Control INPUT Channels 0,1
PPM0-PPM1 OUT: Power Control OUTPUT Channels 0,1
WE0#-WE1#: Write Enable Channels 0,1
CLE0-CLE1: Command Latch Enable Channels 0,1
ALE0-ALE1: Address Latch Enable Channels 0,1
RE0-RE1: Read Enable Channels 0,1
RE0#-RE1#: Read Enable Channels 0,1
CE0#-CE7#: Chip Enable 0-7
R/B0-R/B1: Ready/Busy Channels 0,1
DQS0-DQS1: Data Queue Strobe Channels 0,1
DQS0#-DQS1#: Data Queue Strobe Channels 0,1
IO(0-7)-0: Data I/O Pins 0-7 Channel 0
IO(0-7)-1: Data I/O Pins 0-7 Channel 1

The array of contacts 550 can be arranged in the x-y with row (y-axis) coordinates extending from 0-8 and column (x-axis) coordinates extending from OA-OF for power and ground pins and A-N for signal pins. As shown in FIG. 5, power and ground pins are arranged at the edges of the array which are arranged at the edges of the array, and signal pins are arranged generally in the center of the array. One skilled in the art will appreciate that the pin coordinate system is arbitrary and that any suitable coordinate system may be employed.

The Data I/O Pins, IO(0-7)-0 and IO(0-7)-1, can be used for communicating high-speed data signals to one or more NVM dies in an NVM package (e.g., memory dies 112*a-n* of FIG. 1). In particular, each set of Data I/O Pins can represent an 8-bit communications channel between a controller and an NVM die (e.g., one of memory dies 212*a-h* of FIG. 2). For instance, for the raw NAND NVM package disclosed above with respect to FIG. 2, the controller may be a controller of a host device (e.g., host controller 114 of FIG. 1). On the other hand, for the managed NAND NVM package disclosed above with respect to FIG. 3, the controller may be a memory controller of the NVM package (e.g., memory controller 306 of FIG. 3).

The pin arrangement displayed in FIG. 5 may represent an alternative embodiment for improving signal integrity over Data I/O pins.

The Data I/O Pins of each channel can be arranged in a C-shape surrounding a GND pin. Differential pair signals can be carried over adjacent Data I/O Pins in the C-shape layouts. For example, the following pins may carry differential pair signals for Channel 0: IO0-0 and IO1-0; IO2-0 and IO3-0; IO4-0 and IO5-0; and IO6-0 and IO7-0. The same applies, mutatis mutandis, to the Data I/O Pins for Channel 1. The incorporation of a GND pin within the C-shaped Data I/O Pin layout can further help to improve signal integrity by reducing the ground offset between the pins of each differential pair. The C-shaped layout can also reduce the need to cross high-speed signal carriers within the NVM package, reducing cross-talk between the carriers and thereby improving signal integrity.

Additional pins may be part of the C-shaped Data I/O Pin layout including, for example, the RE0, RE1, RE0#, RE1#, DQS0#, and DQS1# pins.

The C-shaped layout of Data I/O pins can be centered on the y-axis between rows of pins dedicated to non-Data I/O activity. For example, GND, VccQ, Vcc, PPM0 IN, and PPM1 IN pins can be arranged in rows along the top and bottom edges of the array, and the C-shaped Data I/O pin layout can be centered between those rows. Additional pins, including write enable, chip enable, address latch enable, PPM OUT, and command latch enable pins, can be arranged in rows set between the edge rows and the C-shaped layout.

According to some embodiments, the pins dedicated to each channel may be symmetrically placed about a central, y-axis-oriented axis of symmetry. Pins dedicated to each channel can be arranged on either side of the axis of symmetry 570 such that a second LGA can be rotated upside down along the axis of symmetry. As a result, the second LGA's pins can coordinate with the pins of LGA 530. Thus, as shown in FIG. 5, Data I/O pins IO(0-7)-0 can correspond to Data I/O pins IO(0-7)-1 reflected about the axis of symmetry. Similarly, each pin of Channel 0 maps to a corresponding pin of Channel 1 when reflected about the axis of symmetry.

LGA 530 may be used with a stacked NVM package such as NVM package 204 of FIG. 2, for example. As described above, a first subset 552 of contacts 550 dedicated to Channel 0 and arranged on one side of axis of symmetry 570 can be routed with minimum signal carrier distance to communicatively couple first subset 552 with bond pads on the exposed surfaces of memory dies 212*a-d*, for example. Similarly, a second subset 554 of contacts 550 dedicated to Channel 1 and arranged on the other side of the axis of symmetry 570 can be routed with minimum signal carrier distance to communicatively couple subset 554 with bond pads on the exposed surfaces of memory dies 212*e-h*. Because contacts 550 may not be rotationally symmetric about a point, the wiring within NVM package 204 may need to be altered for each channel to account for memory dies 212*a-d* being rotated 180° from memory dies 212*e-h*.

Figure 6:
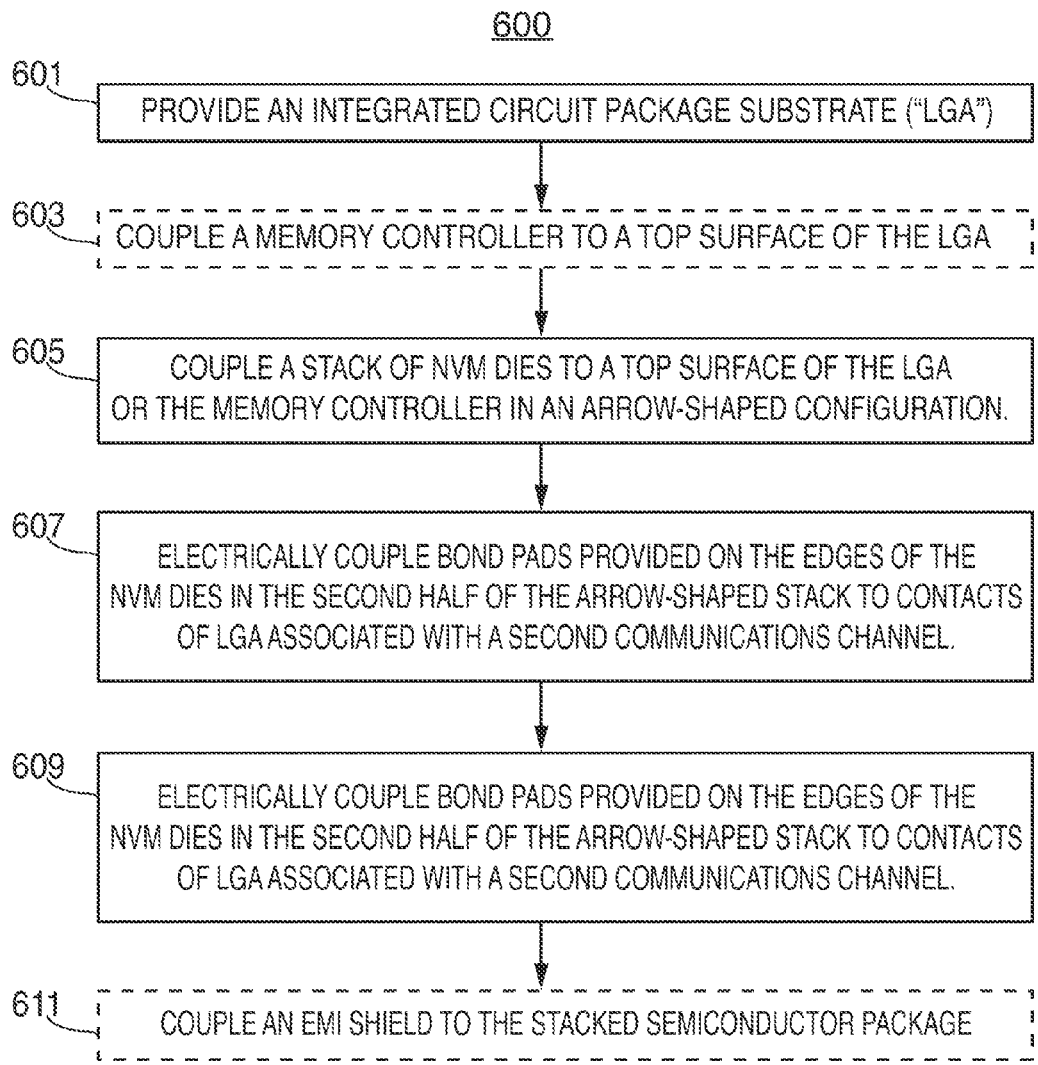
FIG. 6 is a flowchart of a process for manufacturing a stacked semiconductor memory device in accordance with various embodiments.

FIG. 6 is a flowchart of process 600 for manufacturing a stacked semiconductor memory device in accordance with some embodiments. At step 601, an IC package substrate (e.g., LGA 230 of FIG. 2) can be provided. The bottom surface of the LGA can include an array of contacts for communicatively coupling the LGA with a system substrate (e.g., substrate 234 of FIG. 2). The array of contacts may be arranged, for example, as described above with respect to FIGS. 4 and 5. Accordingly, a first communications channel can be provided on a first portion the bottom surface of the LGA, and a second communications channel can be provided on a second portion of the bottom surface of the LGA. Further, the LGA can include any suitable vias and/or traces for routing the contacts on the bottom surface of the LGA to conductive features (e.g., bond pads) on the top surface of the LGA.

Next, at step 603 a memory controller (e.g., memory controller 306 of FIG. 3) can optionally be physically coupled to the LGA. In some embodiments, the memory controller can be coupled to the package substrate in a flip-chip configuration. In these embodiments, the active surface of the memory controller can include a number of solder bumps that allow direct connection between the memory controller and the LGA. In other embodiments, the memory controller can be wire bonded to bond pads provided on a first surface of the LGA. In still further embodiments, the memory controller may be omitted entirely such that the stacked semiconductor memory device is a raw NVM device.

At step 605, a stack of NVM dies (e.g., memory dies 212a-h) can be coupled to the top surface of the LGA or the memory controller in an arrow-shaped configuration with a suitable adhesive. In some embodiments, an epoxy can be introduced between each memory die. The stack can then be arranged into the arrow-shaped stack. Finally, the epoxy can be cured to solidify the stack of memory dies. The stack of memory dies 212a-h can then be affixed to LGA 230 using any suitable method. According to some embodiments, the stack of memory dies 212a-c can be epoxied to LGA 230 at the same time the stack itself is being formed.

Any number of NVM dies can be included in the stack, subject to space, wiring, and/or structural limitations. Each NVM die can be coupled physically to an adjacent die with a suitable adhesive, and the dies may be arranged such that a first half of the NVM dies form a staircase in a first direction and a second half of the NVM dies are rotated 180° and form a staircase in a second direction. The resulting arrow-shaped stack can provide an exposed surface on each NVM die on which bond pads can be provided. Any suitable techniques for depositing and removing conductive materials from a surface may be used to provide the bond pads.

At step 607, the bond pads provided on the edges of the NVM dies in the first half of the arrow-shaped stack can be electrically coupled to a first subset (e.g., first subset 552 of FIG. 5) of contacts of the LGA associated with the first communications channel. In some embodiments, wire-bond wires may be used for this purpose as described above with respect to FIG. 2. Similarly, at step 609, the bond pads provided on the edges of the NVM dies in the second half of the arrow-shaped stack can be electrically coupled to a second subset (e.g., subset 554 of FIG. 5) contacts of the LGA associated with the second communications channel.

Next, at step 611, an EMI shield (e.g., EMI shield 336 of FIG. 3) can optionally be coupled to the stacked semiconductor memory package. The EMI shield may be a hollow can-type EMI shield that can cover all or part of the stacked semiconductor memory package. In some embodiments, the space between the EMI shield and the components of the memory device can be filled with a dielectric material. In those embodiments, a conductive thin film can be deposited on the dielectric material to form the EMI shield. To dissipate charge, the EMI shield can be wired to ground (e.g., a ground pin on a nearby circuit board).

It is to be understood that the steps shown in process 600 of FIG. 6 are merely illustrative and that existing steps may be modified or omitted, additional steps may be added, and the order of certain steps may be altered.

While there have been described systems and methods for stacked semiconductor memory devices, it is to be understood that many changes may be made therein without departing from the spirit and scope of the invention. Insubstantial changes from the claimed subject matter as viewed by a person with ordinary skill in the art, no known or later devised, are expressly contemplated as being equivalently within the scope of the claims. Therefore, obvious substitutions now or later known to one with ordinary skill in the art are defined to be within the scope of the defined elements.

The described embodiments of the invention are presented for the purpose of illustration and not of limitation.

What is claimed is:

1. An integrated circuit ("IC") package substrate, comprising a bottom surface comprising an array of contacts, the array of contacts comprising a plurality of data I/O contacts, wherein:
    a first subset of the plurality of data I/O contacts forms a first loop-shaped layout arranged on a first side of the bottom surface;
    a second subset of the plurality of data I/O contacts forms a second loop-shaped layout arranged on a second side of the bottom surface; and
    the first side and the second side are reflectively symmetrical about a central axis, wherein
    the array of contacts further comprising a plurality of ground ("GND") contacts, wherein only two GND contacts of the plurality of GND contacts are surrounded by the data I/O contacts of the first and second subsets of the plurality of data I/O contacts.

2. The IC package substrate of claim 1, the array of contacts further comprising a plurality of data queue stroke ("DQS") contacts, wherein at least one DQS contact of the plurality of DQS contacts is surrounded by the data I/O contacts of each of the first and second subsets of the plurality of data I/O contacts.

3. The IC package substrate of claim 1, wherein the first subset of the plurality of data I/O contacts comprises a first communications channel, and the second subset of the plurality of data I/O contacts comprises a second communications channel.

4. The IC package substrate of claim 1, the array of contacts further comprising a plurality of write enable ("WE") contacts arranged in two parallel diagonal axes between the first and loop-shaped layouts.

5. The IC package substrate of claim 4, wherein a first subset of the WE contacts is arranged in a first of the two parallel diagonal axes adjacent to the first loop-shaped layout, and wherein a second subset of the WE contacts is arranged in a second of the two parallel diagonal axes adjacent to the second loop-shaped layout.

6. The IC package substrate of claim 5, wherein the first subset of the WE contacts maps onto corresponding WE contacts of the second subset of the plurality of WE contacts upon 180 ° rotation about the point of symmetry located on the central axis.

7. The IC package substrate of claim 1, wherein the first subset of data I/O contacts comprises a plurality of differential pair data contacts, a plurality of read enable contacts, a plurality of data queue stroke ("DQS") contacts, and one of the only two GND contacts; and
    wherein the second subset of data I/O contacts comprises a plurality of differential pair data contacts, a plurality of read enable contacts, a plurality of DQS contacts, and one of the only two GND contacts.

8. The IC package substrate of claim 7, wherein, in the first loop, the GND contact is adjacent to each of the read enable contacts and each of the DQS contacts, and in the second loop, the GND contact is adjacent to each of the read enable contacts and each of the DQS contacts.

9. The IC package substrate of claim 1, wherein the array of contacts further comprises a plurality of non-Data I/O contacts arranged in rows along top and bottom edges of the bottom surface, wherein the first and second loops are arranged between those rows.

10. The IC package substrate of claim 9, wherein the non-Data I/O contacts are the only contacts in the rows.

* * * * *